(12) United States Patent
Yamada (10) Patent No.: US 6,236,434 B1
(45) Date of Patent: May 22, 2001

(54) SOLID STATE IMAGE PICKUP DEVICE (75) Inventor: Tetsuo Yamada, Miyagi (JP)

(73) Assignees: Fuji Photo Film Co., Ltd., Kanagawa; Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 08/960,056

(22) Filed: Oct. 29, 1997

(30) Foreign Application Priority Data

Oct. 30, 1996 (JP) ................................... 8-288856

(51) Int. Cl.⁷ .................................................. H04N 5/335
(52) U.S. Cl. ............................................. 348/315; 348/372
(58) Field of Search .................................. 348/207, 311, 348/314, 315, 316, 317, 318, 319, 272, 273, 275, 278, 279, 280; 250/208.1; H04N 5/335

(56) References Cited

U.S. PATENT DOCUMENTS

| 4,558,365 | * | 12/1985 | Ochi | 348/315 |
|---|---|---|---|---|
| 4,602,289 | * | 7/1986 | Sekine | 348/315 |
| 5,210,613 | * | 5/1993 | Lee | 348/315 |
| 5,306,906 |   | 4/1994 | Aoki et al. . |  |
| 5,376,967 |   | 12/1994 | Sakota et al. | 348/311 |
| 5,528,291 |   | 6/1996 | Oda | 348/220 |
| 5,608,455 |   | 3/1997 | Oda | 348/245 |

FOREIGN PATENT DOCUMENTS

| 5-91415 | 4/1993 | (JP) | H04N/5/335 |
|---|---|---|---|
| 5-219445 | 8/1993 | (JP) | H04N/5/335 |

* cited by examiner

*Primary Examiner*—Tuan Ho
(74) *Attorney, Agent, or Firm*—Sughrue, Mion, Zinn, Macpeak & Seas, PLLC (57) ABSTRACT

Photosensor rows are disposed in such a manner that one photosensor row is shifted by a half of a layout pitch of photosensors, relative to another adjacent photosensor row. Column direction charge transfer devices are disposed in such a manner that two column direction charge transfer devices are disposed between adjacent two photosensors in the row direction and one column direction charge transfer device is disposed between obliquely adjacent two photosensors.

23 Claims, 9 Drawing Sheets

SOLID STATE IMAGE PICKUP DEVICE

This application is based on Japanese patent application No. 8-288856 filed on Oct. 30, 1996, the entire contents of which are incorporated herein by reference.

BACKGROUND OF THE INVENTION a) Field of the Invention

The present invention relates to a solid state image pickup device, and more particularly to the structure of a solid state image pickup device suitable for realizing high resolution and capable of reading pixel signals of one frame at the same time.

b) Description of the Related Art

Charge transfer type solid state image pickup devices or so-called charge coupled devices (CCD) have been developed, and they are used with cameras of televisions, video tape recorders and the like of NTSC standards. In NTSC standards, an image of one frame is divided into signals of two fields through interlace scanning, and signal charges of photosensors of the first or second field are read at the same time. In other words, two photosensors are generally provided with one transfer stage.

Non-interlace scanning is necessary, however, for electronic still cameras or televisions of new standards. In this case, one photosensor is provided with one transfer stage (generally four electrodes). As a method of configuring this structure, a solid state image pickup device having the structure shown in FIG. 9 has been proposed.

Figure 9:
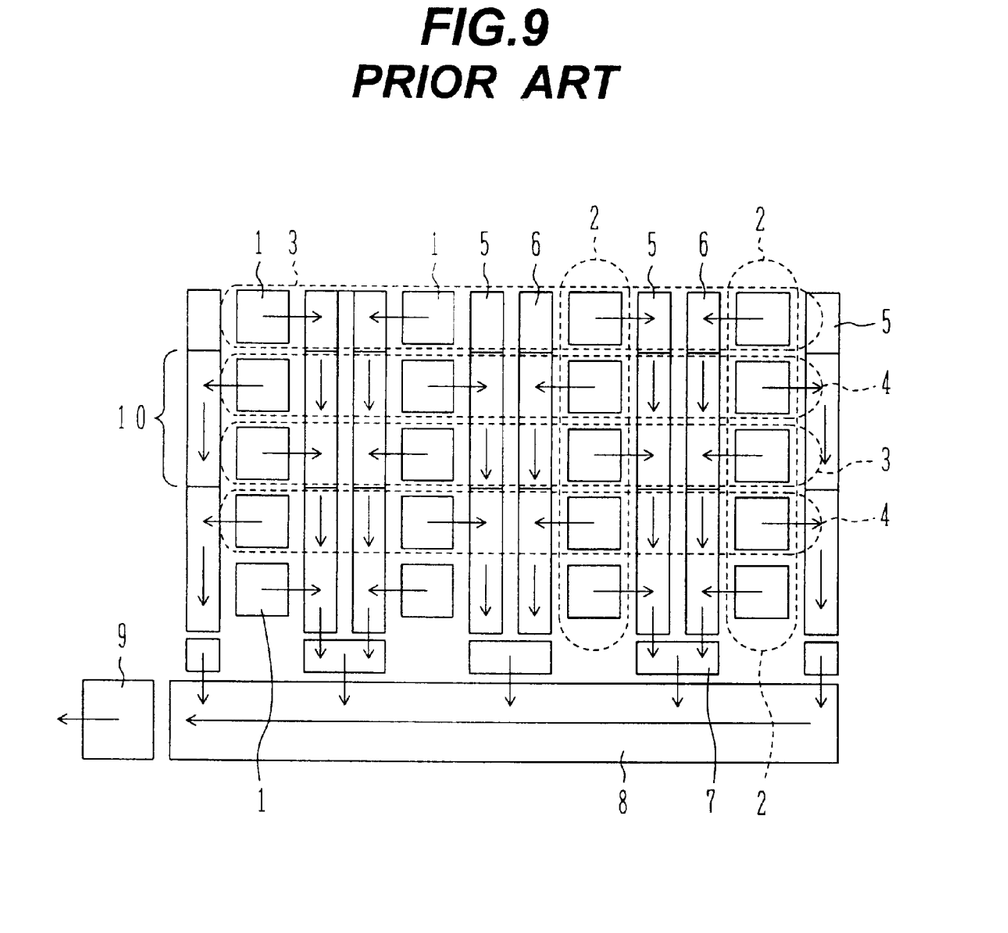
FIG. 9 is a schematic plan view showing at a larger scale a partial area of a solid image pickup device of the type that signals of all pixels of one frame is read at the same time, according to conventional techniques.

FIG. 9 is a schematic plan view showing at a larger scale a partial area of a solid image pickup device of the non-interlace type that signals of all pixels of one frame can be read at the same time. Reference numeral 1 represents a photoelectric conversion element (hereinafter also called a photosensor) such as a photodiode. Photosensors 1 surrounded by each broken line 2 and disposed in the vertical direction as viewed in FIG. 9 (hereinafter called a column direction) constitute a photosensor column. Photosensors 1 surrounded by each broken line 3 and disposed in the horizontal direction (hereinafter called a row direction) constitute a first photosensor row. Photosensors 1 surrounded by each broken line 4 and disposed in the horizontal direction constitute a second photosensor row. The first and second photosensor rows 3 and 4 are alternately Juxtaposed in the column direction.

Reference numeral 5 represents a first column direction charge transfer device for reading signal charges of the photosensors 1 disposed on the left side and transferring the read charges in the column direction. Reference numeral 6 represents a second column direction charge transfer device for reading signal charges of the photosensors 1 disposed on the right side and transferring the read charges in the column direction. The first and second column direction charge transfer devices 5 and 6 are disposed on both sides of each photosensor column 2.

Reference numeral 7 represents a controller for controlling to select signal charges transferred by either the first or second column direction charge transfer device 5, 6 and transferring the selected signal charges to a row direction charge transfer device 8 which transfers the received signal charges in the row direction. Reference numeral 9 represents an output circuit for generating voltages corresponding to the amounts of signal charges transferred from the row direction charge transfer device 8 and outputting the generated voltages to an external circuit (not shown). The photosensors 1, column direction charge transfer devices 5 and 6, controllers 7, row direction charge transfer device 8 and output circuit 9 are all integrally formed on a single semiconductor substrate (not shown).

In the above-described solid state image pickup device shown in FIG. 9, the column direction charge transfer devices 5 and 6 are disposed on both sides of each photosensor column 2 to provide one transfer stage 10 per one photosensor 1. Each of the column direction charge transfer devices 5 and 6 is constituted of a plurality of transfer stages 10 disposed in the column direction. The transfer stage 10 includes charge signal storage regions (packets).

Since the column direction charge transfer devices 5 and 6 are disposed in two columns between adjacent two photosensor columns 2, the distance between the photosensors 1 or photosensor columns 2 in the horizontal direction (row direction) becomes about a twofold of a distance of an interlace device structure. This area between the photosensors 2 is a photoelectrically inactive area which narrows an aperture of image sampling (photoelectrically active area) and may generate false signals such as moire.

Since the photoelectrically inactive area is broad, the area of each photosensor 1 reduces so that the amount of light incident upon the photosensor 1 reduces and hence the photoelectric conversion sensitivity lowers. A more significant problem is a difficulty of realizing high integration.

Further, the directions of reading signal charges from the photosensors 1 in the column direction change alternately right and left in the row direction (indicated by right- and left-hand arrows). If the relative position of the photosensor column 2 and the column direction charge transfer devices 5 and 6 is displaced during the manufacture processes of solid state image pickup devices, the characteristics of reading all pixel signals at the same time change between the upper and lower photosensors 1. For example, if the photosensors 1 are displaced to the right relative to the column direction charge transfer devices 5 and 6, the relative position of the photosensors 1 constituting the first photosensor row 3 and the first column transfer device 5 becomes short whereas the relative position of the photosensors 1 constituting the second photosensor row 4 and the second column transfer device 6 becomes long. Therefore, signal charges of the first photosensor row 3 are easy to read, whereas signal charges of the second photosensor row 4 are difficult to read.

Still further, since the amounts of false signals called smear are different between the first and second column direction charge transfer devices 5 and 6, a display quality is degraded because vertical stripe patterns are formed. Smear is generated by the leakage of a fraction of light incident upon the photosensor 1 to the column direction charge transfer devices 5 and 6.

SUMMARY OF THE INVENTION

It is an object of the present invention to provide a solid state image pickup device with a novel layout of its components.

It is another object of the present invention to provide a solid image pickup device with a novel structure capable of suppressing false signals such as moire, improving a photoelectric conversion efficiency, realizing high integration, optimizing spatial sampling of an image, and reducing a difference of the characteristics between photosensors to be caused by a position displacement of photosensors and column direction charge transfer devices during manufacture processes.

According to one aspect of the present invention, there is provided a solid state image pickup device comprising: a plurality of photoelectric conversion elements disposed at a predetermined layout pitch in both row and column directions; and a plurality of column direction charge transfer devices for transferring in the column direction, electric charges output from the plurality of photoelectric conversion elements disposed in the column direction, wherein one row of the photoelectric conversion elements is shifted by about a half of the layout pitch, relative to another adjacent row, and the column direction charge transfer devices stretch in a zigzag line like weaving the photoelectric conversion elements in such a manner that two column direction charge transfer devices are disposed between adjacent two photoelectric conversion elements disposed in the row direction and one column direction charge transfer device is disposed between obliquely adjacent two photoelectric conversion elements disposed in an oblique direction.

DETAILED DESCRIPTION OF THE PREFERRED EMBODIMENTS

Figure 1:
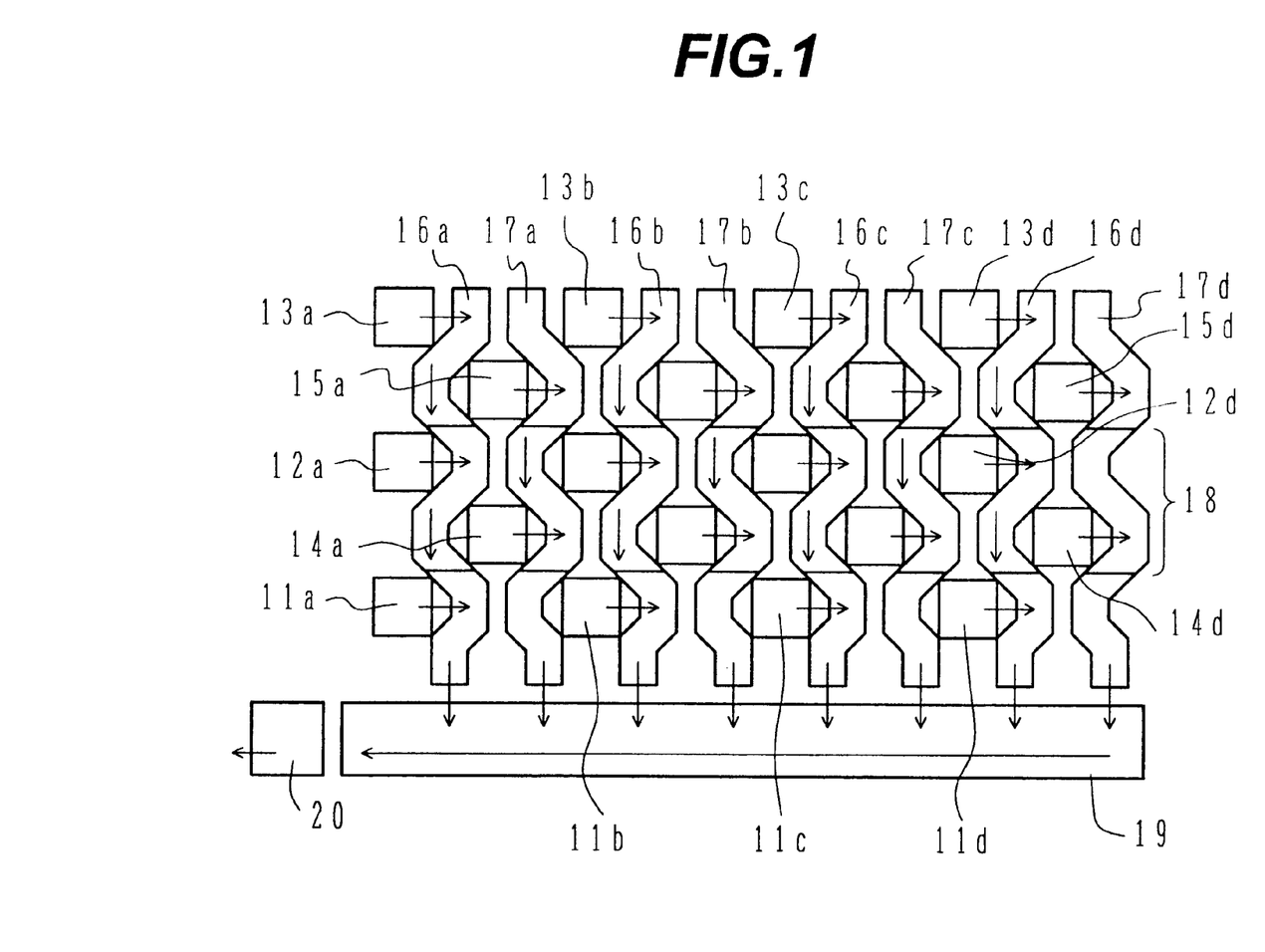
FIG. 1 is a schematic plan view showing at a larger scale a partial area of a solid image pickup device of the type that signals of all pixels of one frame is read at the same time, according to a first embodiment of the invention.

FIG. 1 is a schematic plan view showing at a larger scale a partial area of a solid image pickup device according to the first embodiment of the invention. In FIG. 1, reference symbols 11a to 11d represent photosensors constituting a first photosensor row, reference symbols 14a to 14d represent photosensors constituting a second photosensor row, reference symbols 12a to 12d represent photosensors constituting a third photosensor row, reference symbols 15a to 15d represent photosensors constituting a fourth photosensor row, and reference symbols 13a to 13d represent photosensors constituting a fifth photosensor row. Photosensors in each row are shown by squares and are photodiodes for example.

Stripe regions 16a to 16d, having a shape stretching in a zigzag line along photosensors in the column direction, constitute first column direction charge transfer devices, and stripe regions 17a to 17d of the same shape constitute second column direction charge transfer devices.

Consider now one column direction charge transfer device, for example, device 16c and its adjacent column direction charge transfer devices 17b and 17c. The charge transfer device 16c stretches in a zigzag line and bends at a constant pitch. The charge transfer device 17b is in plane symmetry (line symmetry in FIG. 1) with the charge transfer device 16c. Therefore, between the charge transfer devices 17b and 16c, an open area with a broad gap is formed at the above described constant pitch, and each photosensor is disposed in this open area. The charge transfer device 17c is also in plane-symmetry with the charge transfer device 16c. Therefore, the charge transfer devices 16c and 17c define open areas with a broad gap at the constant pitch. The positions of the open areas with the broad gap are shifted by a half pitch on the right and left sides of the charge transfer device.

A section generally indicated at 18 corresponds to one transfer stage of the column direction charge transfer device. Each of the column direction charge transfer devices 16a–16d and 17a–17d is constituted of a plurality of transfer stages 18 disposed in series in the column direction.

Of the first to fifth photosensor rows, the even number rows 14a–14d and 15a–15d are formed at the positions displaced (shifted) in the row direction by about a half of a pitch PT, relative to the odd number rows 11a–11d, 12a–12d and 13a–13d. The pitch PT is defined as a distance between the centers of adjacent photosensors in the row. This shift amount is preferably in a range of PT×½ +/− PT×0.2.

The column direction charge transfer devices 16a–16d and 17a–17d stretch like weaving the photosensors disposed as above, in a zigzag line alternately moving near to and far from each other in column axis symmetry. Each photosensor is disposed in the open area with the broad gap formed between the two column direction charge transfer devices moving away from each other. Consider now the first photosensor row 11a–11d. An area between two adjacent photosensors (e.g., 11a and 11b) inclusive of the two column direction charge transfer devices (16a and 17a) is a photoelectrically inactive area which is also formed in the conventional structure shown in FIG. 9. In this embodiment, however, each photosensor of the second photosensor row 14a–14d is disposed just above each photoelectrically inactive area of the first row. Signal charges of the photoelectrically inactive areas of the first row can be interpolated by signal charges of the photosensors of the second row. In other words, photosensors are disposed in the gaps (open areas) between any pair of adjacent column direction charge transfer devices.

Since only one column direction charge transfer device is interposed between obliquely opposing adjacent photosensors, the oblique distance between such adjacent photosensors can be shortened more than the conventional solid state image pickup device shown in FIG. 9.

For the interpolation of signal charges, an average value of signal charges of the upper and lower photosensors of each photoelectrically inactive area may be used as quasi signal charges of this inactive area. It is therefore possible to obtain image pickup signals from the photosensors and photoelectrically inactive areas as if each photoelectrically inactive area had a photosensor. With such signal processing providing quasi photosensors at each inactive area, a resolution near to a twofold of the actual number of photosensors In each row direction can be realized.

In the conventional structure shown in FIG. 9, two column direction charge transfer devices are juxtaposed side by side and the photoelectrically inactive area is formed in this area. A photosensor is formed neither above nor under a photoelectrically inactive area between a pair of adjacent photosensors disposed in the row direction. Therefore, the interpolation processing of the first embodiment is impossible and the resolution in the row direction cannot be raised. A row direction charge transfer device 19 and an output circuit 20 shown in FIG. 1 operate in the same manner as the row direction charge transfer device 8 and output circuit 9 shown in FIG. 9, and so the detailed description thereof is omitted.

In the embodiment shown in FIG. 1, the number of transfer stages 18 of the column direction charge transfer devices is the same as the total number of photosensors. Therefore, signal charges of all photosensors can be read and transferred at the same time. In this case, the signal charges of all photosensors are read by the right-side transfer stages 18. Signal charges of the odd number photosensor rows 11a–11d, 12a–12d and 13a–13d are read by the right-side first column charge transfer devices 16a to 16d. Signal charges of the even number photosensor rows 14a–14d and 15a–15d are read by the right-side second column charge transfer devices 17a to 17d. The row direction charge transfer device 19 transfers signal charges in the row direction.

In the solid state image pickup device shown in FIG. 9, the directions of reading signal charges of photosensors in the column direction alternately change right and left. Therefore, if the relative position of the photosensor column and the column direction charge transfer device is displaced, the distance from each photosensor to the column direction charge transfer device becomes different between adjacent two photosensors in the column direction, and therefore the read characteristics and the like of each photosensor become different. In this embodiment, however, even if such position displacement occurs, the distance from each photosensor to the column direction charge transfer device changes by the same amount for all photosensors because signal charges of all photosensors are read only in the right direction. Accordingly, the distance is generally the same for all photosensors and the read characteristics and the like are generally the same for all photosensors. High precision alignment does not necessarily required therefore in the manufacture processes of solid state image pickup devices. The two-dimensional relative position of the photosensors and column direction charge transfer devices is maintained constant. The structure of this embodiment does not require novel manufacture techniques, but known manufacture techniques can be utilized.

Figure 8:
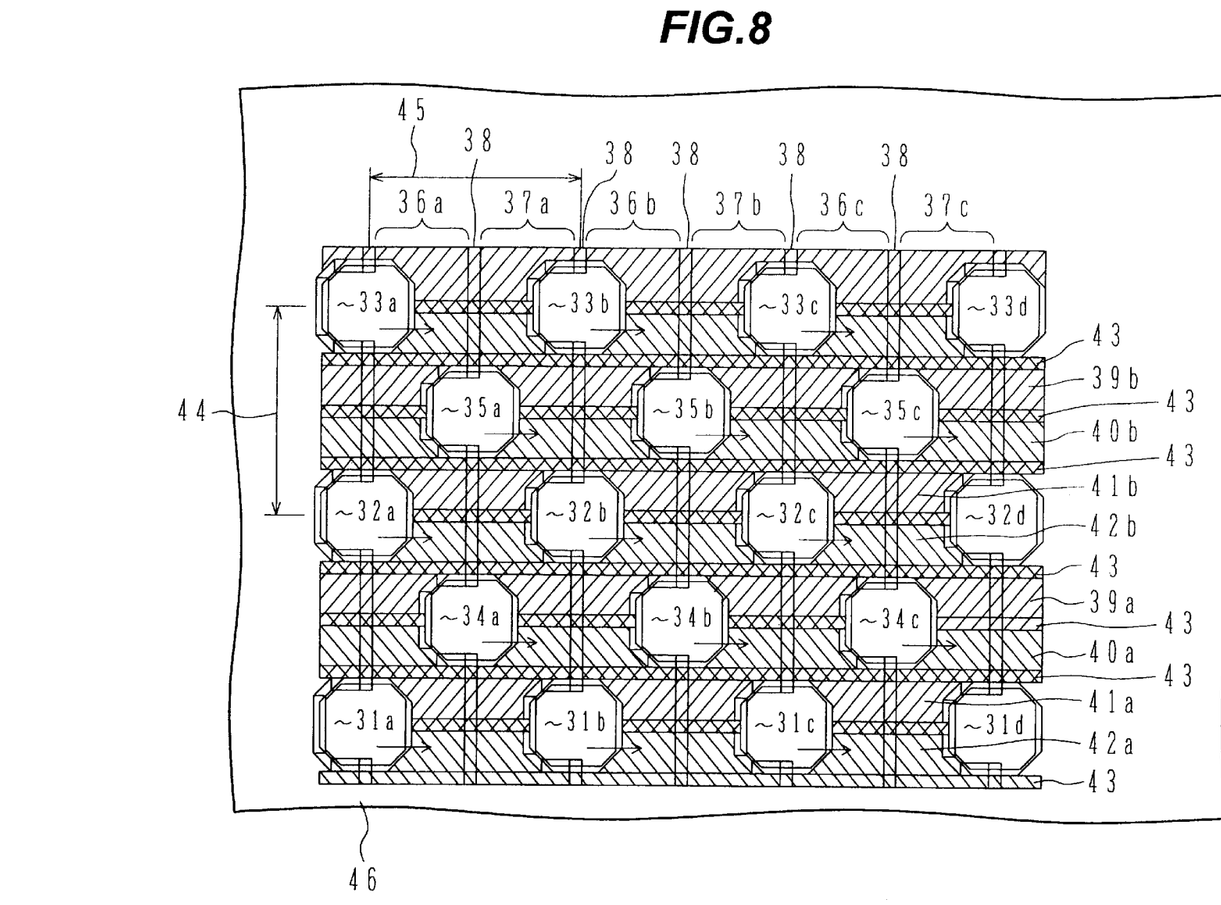
FIG. 8 is a schematic plan view partially showing in more detail at a larger scale the structure of the solid state image pickup device of the first embodiment.

The more specific layout of the solid state image pickup device shown in FIG. 1 is shown in the plan view of FIG. 8. In FIG. 8, reference symbols 31a to 31d represent photosensors constituting a first photosensor row, reference symbols 34a to 34d represent photosensors constituting a second photosensor row, reference symbols 32a to 32d represent photosensors constituting a third photosensor row, reference symbols 35a to 35d represent photosensors constituting a fourth photosensor row, and reference symbols 33a to 33d represent photosensors constituting a fifth photosensor row. Each photosensor is shown by an octagon. A pitch 45 between adjacent photosensors in the row direction is generally the same as a pitch in the column direction. Photosensors are disposed generally at the same pitch both in the row and column directions. Generally the same means that a difference between pitches is 20% or less of an average value of both pitches.

Reference symbols 36a–36c represents a first column direction charge transfer device, and reference symbols 37a–37c represents a second column direction charge transfer device. Reference numeral 38 represents an element isolation region which is formed of a high impurity concentration region formed in a semiconductor region and having a conductivity type opposite to signal charges. This element isolation region electrically isolates each column direction charge transfer device, and isolates the column direction charge transfer device from a portion of each photosensor. Regarding the general knowledge of a solid state image pickup device, reference may be made to U.S. Pat. No. 5,528,291 issued on Jun. 18, 1996, or U.S. Pat. No. 5,608,455 issued on Mar. 4, 1997, which are incorporated herein by reference.

The column direction charge transfer device includes a plurality of conductive electrodes formed on a semiconductor substrate 46 with an insulating film (not shown) being interposed therebetween. In this embodiment, these conductive electrodes correspond to portions integrated in the row direction indicated by reference symbols 39a–42a and 39b–42b (hatched portions). In the solid state image pickup device of this invention, a known four-phase driving transfer device is used which forms one transfer stage by using four electrodes 39a to 42a. In this embodiment, a known stacked electrode structure with partially overlapped areas is adopted, the stacked electrode structure being constituted of a first conductive layer 39a, 41a, 39b, and 41b and a second conductive layer 40a, 42a, 40b and 42b. A first-phase transfer clock voltage is applied to the electrodes 39a and 39b, a second-phase transfer clock voltage is applied to the electrodes 40a and 40b, a third-phase transfer clock voltage is applied to the electrodes 41a and 41b, and a fourth-phase transfer clock voltage is applied to the electrodes 42a and 42b. A narrow line region 43 between electrodes corresponds to an overlap area between the two stacked electrodes. The embodiment can be realized by a four-phase drive method using a know two-layer stacked electrode structure. Regarding the general knowledge of two-layer stacked electrodes and four-phase drive, reference may be made to JP-A-5-219445 and U.S. Pat. No. 5,376,967 issued on Dec. 27, 1994, which are incorporated herein by reference.

Figure 2:
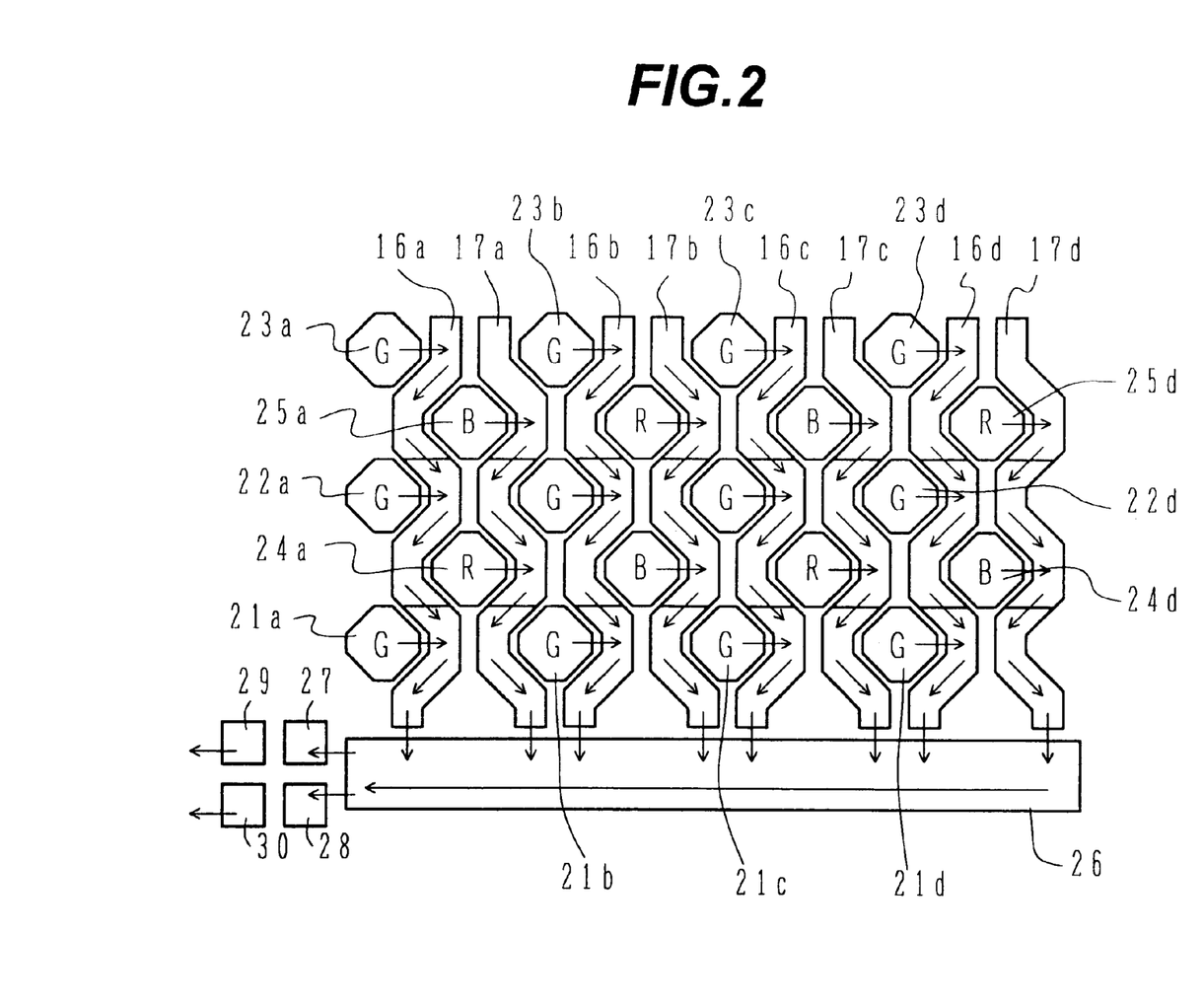
FIG. 2 is a schematic plan view showing at a larger scale a partial area of a solid image pickup device of the type described above, according to a second embodiment of the invention.

FIG. 2 is a plan view showing at a larger scale a portion of a solid state image pickup device according to the second embodiment of the invention. In FIG. 2, reference symbols 21a to 21d represent photosensors constituting a first photosensor row, reference symbols 24a to 24d represent photosensors constituting a second photosensor row, reference symbols 22a to 22d represent photosensors constituting a third photosensor row, reference symbols 25a to 25d represent photosensors constituting a fourth photosensor row, and reference symbols 23a to 23d represent photosensors constituting a fifth photosensor row.

Reference symbols 16a to 16d represent a first column direction charge transfer device, and reference symbols 17a to 17d represent a second column direction charge transfer device. Each photosensor is shown by an octagon. In this embodiment, the shape of each photosensor is octagonal whose sides match the zigzag angle of each column direction charge transfer device. This shape provides a maximum light receiving area.

In this embodiment shown in FIG. 2, color filters indicated at G (green), B (blue) and R (red) are formed on a light receiving area of each photosensor. G filters are formed on all photosensors of the odd number photosensor rows 21a–21d, 22a–22d and 23a–23d, and R and G filters are formed on photosensors of the even number photosensor rows 24a–24d and 25a–25d, alternately in both the row and column directions. The number of G filters is larger than that of B and G filters because green influences the resolution more than blue and red.

In this embodiment, signal charges (G signal charges) of the photosensors with G filters are read and transferred to the right-hand first column direction charge transfer devices 16a to 16d, and signal charges (B and R signal charges) of the photosensors with B and R filters are read and transferred to the right-hand second column direction charge transfer devices 17a to 17d.

In the embodiment shown in FIG. 2, the column direction charge transfer device is formed of a main transfer device 26, a first branch device 27 and a second branch device 28. The main transfer device 26 receives in parallel the signal charges transferred from the first and second column direction charge transfer devices 16a to 16d and 17a to 17d, and transfers the received signal charges in the row direction. The first branch device 27 branches the G signal charges from the main transfer device 26 to a first output circuit 29, and the second branch device 28 branches the B and R signal charges from the main transfer device 26 to a second output circuit 30. For example, of signal charges transferred by the main transfer device 26 in the order of G, R, G, and B, the G signal charges are transferred to the first branch device 27 and the R and B signal charges are transferred to the second branch device 28. In this case, the first output circuit 29 outputs a G signal voltage, and the second output circuit 30 outputs R and B signal voltages. This separate voltage output facilitates the succeeding signal processing.

Figure 3:
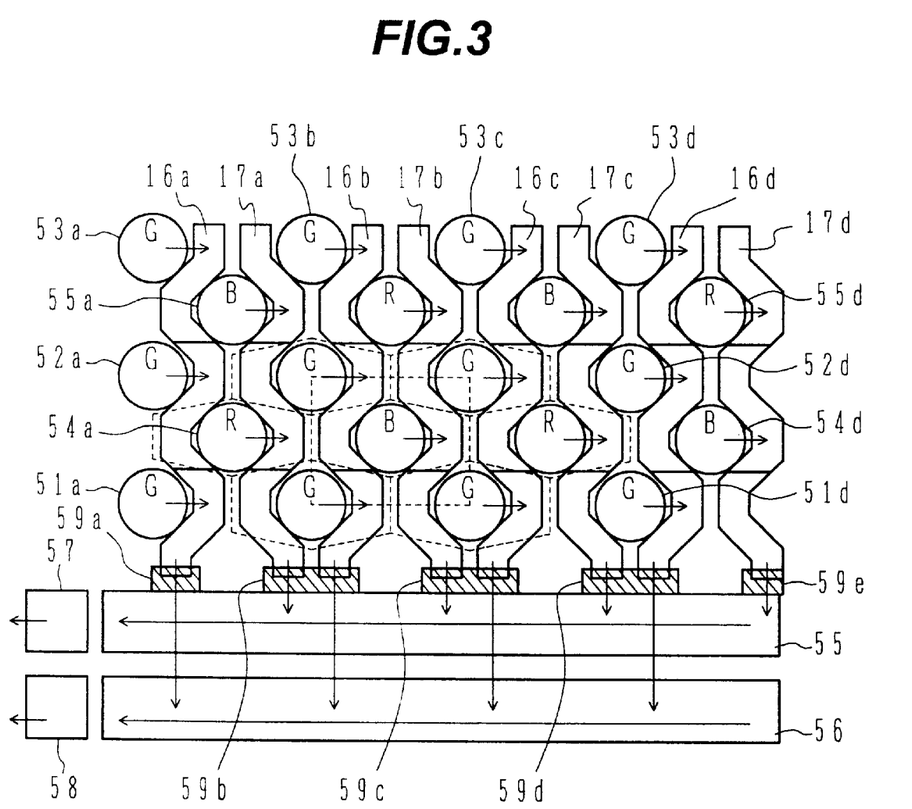
FIG. 3 is a schematic plan view showing at a larger scale a partial area of a solid image pickup device of the type described above, according to a third embodiment of the invention.

FIG. 3 is a plan view showing at a larger scale a portion of a solid state image pickup device according to the third embodiment of the invention. In FIG. 3, reference symbols 51a to 51d represent photosensors constituting a first photosensor row, reference symbols 54a to 54d represent photosensors constituting a second photosensor row, reference symbols 52a to 52d represent photosensors constituting a third photosensor row, reference symbols 55a to 55d represent photosensors constituting a fourth photosensor row, and reference symbols 53a to 53d represent photosensors constituting a fifth photosensor row. Reference symbols 16a to 16d represent a first column direction charge transfer device, and reference symbols 17a to 17d represent a second column direction charge transfer device. G, B and R indicate colors of each color filter. The layout of color filters is the same as the second embodiment shown in FIG. 2.

In the third embodiment, each photosensor has a circular or elliptical shape. With the circular or elliptical shape of a photosensor, a micro lens (not shown) to be formed on the photosensor can be made circular or elliptical which provides best light convergence.

A method of reading G, B and R signal charges from the photosensors and transferring them to the column direction charge transfer device 16a–16d and 17a–17d and thereafter transferring them in the column direction is the same as the second embodiment shown in FIG. 2. In the third embodiment, first and second row direction charge transfer devices 55 and 56 are separately provided. The first row direction charge transfer device 56 transfers in the row direction the G charge signals from the first column direction charge transfer devices 16a to 16d, and the second row direction charge transfer device 55 transfers in the row direction the B and R charge signals from the second column direction charge transfer devices 17a to 17d. The first and second row direction charge transfer devices 55 and 56 are connected to output circuits 58 and 57, respectively.

Since two row direction charge transfer devices are separately used, R, B and G high density signal charges transferred from the two column direction charge transfer devices can be changed to a half density in the spatial domain by the separated row direction charge transfer devices. Therefore, an integration degree of the row direction charge transfer device can be alleviated by a half of the integration degree required for the un-divided row direction charge transfer device. The transfer frequency of the row direction charge transfer devices and output circuits can be lowered to a half of the frequency required for the un-divided device and output circuit, so that a power consumption can be reduced greatly.

Reference symbols 59a to 59e shown in FIG. 3 represent transfer controllers for transferring signal charges from the column direction charge transfer device to the row direction charge transfer device. The controller operates first to transfer signal charges from the first column direction charge transfer devices 16a to 16d to the row direction charge transfer device 56 via the row direction charge transfer device 55, and succeedingly to transfer signal charges from the second column direction charge transfer devices 17a to 17d to the row direction charge transfer device 55. This method of transferring charges by using the two row direction charge transfer devices 55 and 56 is described, for example, in the explanation of FIGS. 2 and 6 of JP-A-5-91415 which is incorporated herein by reference.

Figure 4:
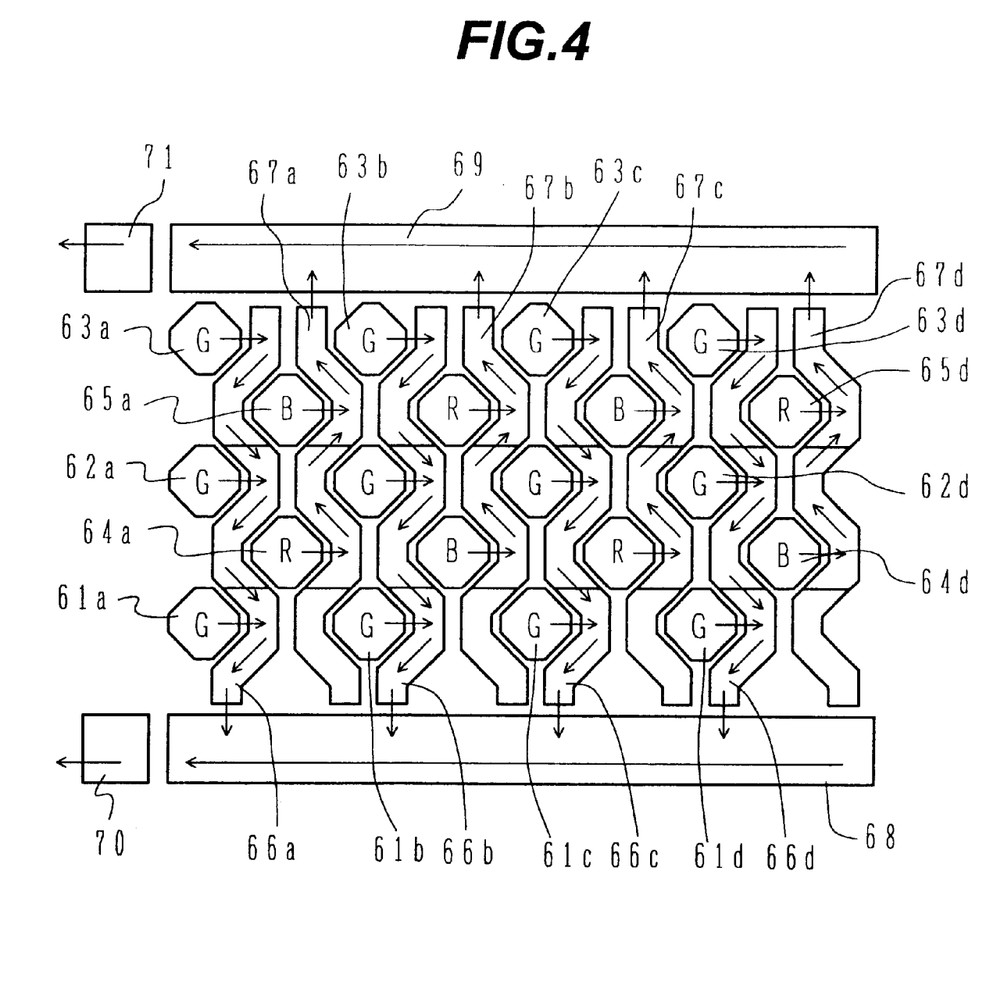
FIG. 4 is a schematic plan view showing at a larger scale a partial area of a solid image pickup device of the type described above, according to a fourth embodiment of the invention.

FIG. 4 is a plan view showing at a larger scale a portion of a solid state image pickup device according to the fourth embodiment of the invention. In FIG. 4, reference symbols 61a to 61d represent photosensors constituting a first photosensor row, reference symbols 64a to 64d represent photosensors constituting a second photosensor row, reference symbols 62a to 62d represent photosensors constituting a third photosensor row, reference symbols 65a to 65d represent photosensors constituting a fourth photosensor row, and reference symbols 63a to 63d represent photosensors constituting a fifth photosensor row. Reference symbols 66a to 66d represent a first column direction charge transfer device, and reference symbols 67a to 67d represent a second column direction charge transfer device. G, B and R indicate colors of each color filter. The layout of color filters is the same as the second and third embodiments.

In the fourth embodiment, the direction of transferring signal charges of the first column direction charge transfer devices 66a to 66d is opposite to the direction of transferring signal charges of the second column direction charge transfer devices 67a to 67d. Signal charges generated by the odd number photosensor rows 61a–61d, 62a–62d and 63a–63d are read and transferred to the first column direction charge transfer devices 66a to 66d and transferred to a first row direction charge transfer device 68 shown in the lower area of FIG. 4. Signal charges generated by the even number photosensor rows 64a–64d and 65a–65d are read and transferred to the second column direction charge transfer devices 67a to 67d and transferred to a second row direction charge transfer device 69 shown in the upper area of FIG. 4.

G signal charges are therefore transferred by the lower row direction charge transfer device 68 to an output circuit 70, whereas R and B signal charges are transferred by the upper row direction charge transfer device 69 to another output circuit 71. Although the signals output from the upper and lower output circuits 70 and 71 have the reversed sequential order, this poses no practical problem if the output signals are temporarily stored in a memory and read in the order opposite to the order of writing data in the memory.

Next, examples of the layout of color filters or micro lenses disposed on the color filters used by a solid state image pickup device will be described with reference to the plan views of FIGS. 5 to 7. In the description with FIGS. 5 to 7, although examples of the layout of color filters are used, this description is also applicable to micro lenses.

Figure 5:
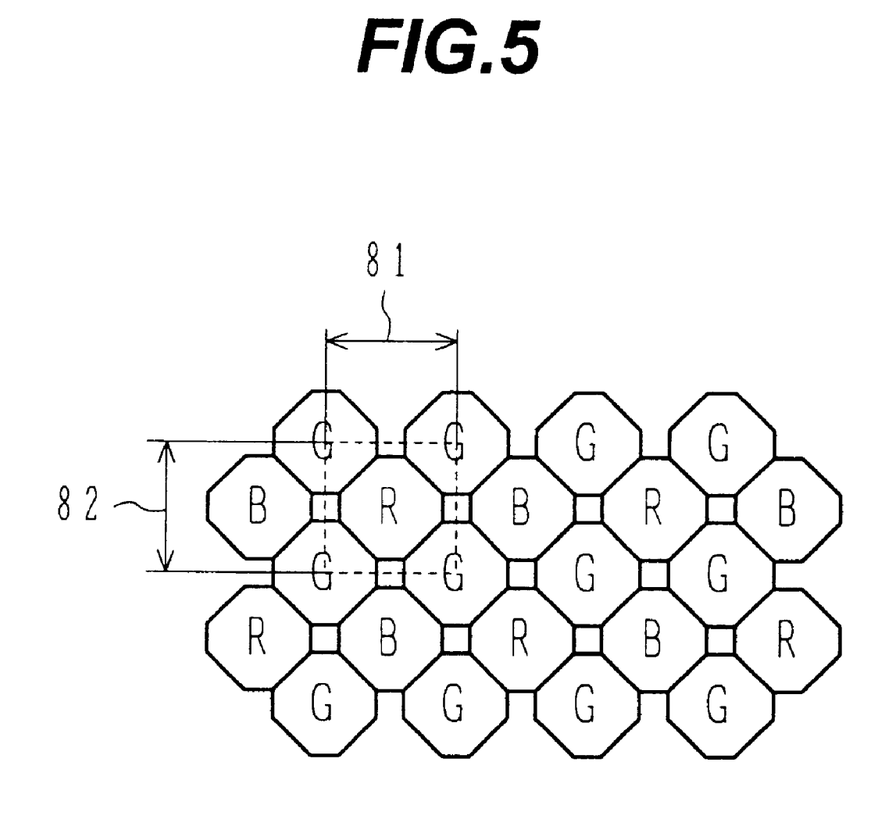
FIGS. 5 to 7 are plan views showing examples of the layout of color filters according to an embodiment of the invention.

In the example shown in FIG. 5, G filters are disposed in a square lattice shape as indicated by a broken line. An R or B filter is disposed at the center of each lattice surrounded by four G filters. A pitch 81 in the row direction is set equal to a pitch 82 in the column direction. In this example, each filter (or micro lens) is octagonal.

Figure 6:
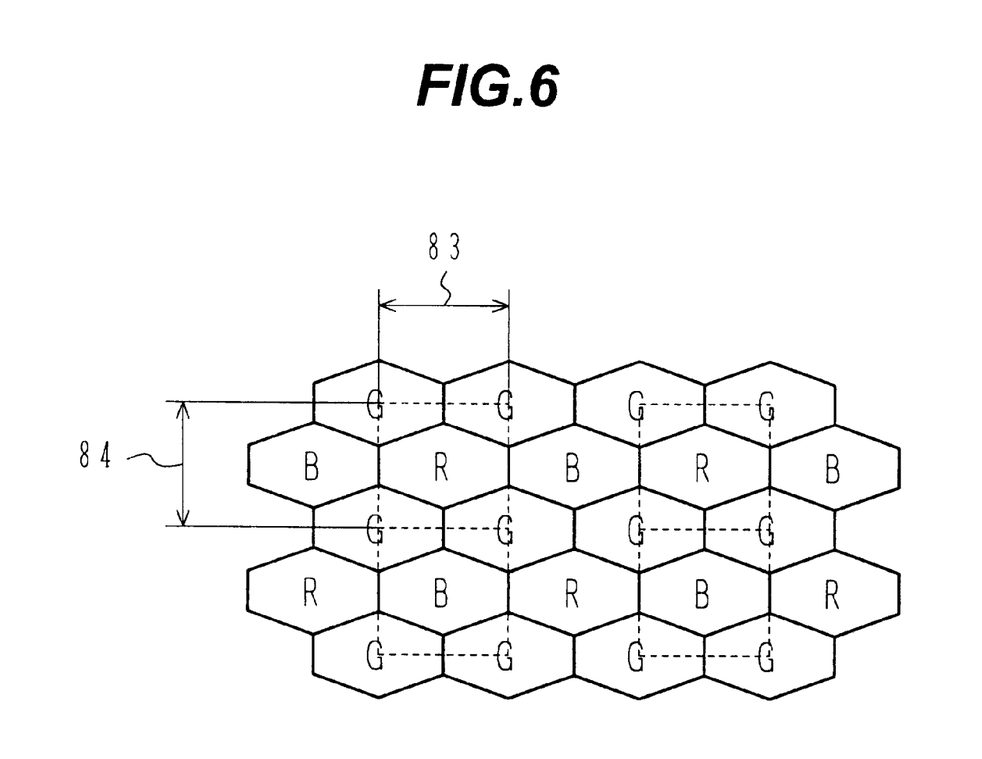

In the example shown in FIG. 6, G filters are disposed in the same pattern as FIG. 5, and each filter (or micro lens) is hexagonal. A filter or micro lens is preferably polygonal having six sides or more. A pitch 83 in the row direction is set equal to a pitch 84 in the column direction.

Figure 7:
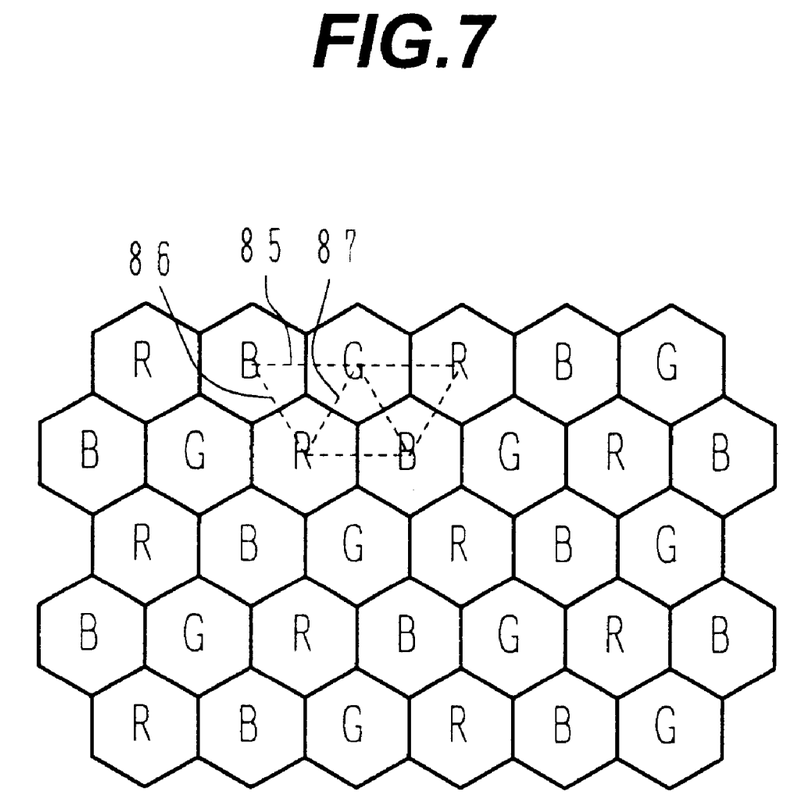

In the example shown in FIG. 7, the shape of each filter (or micro lens) is an equilateral hexagon, and distances 85, 86, 87 between centers of adjacent filters are all set generally the same. Generally the same means that a difference between distances is 20% or less of an average value of all distances. In this example, all R, G and B filters are disposed uniformly and isogonally over the whole area. Red, green and blue color filters are formed on three adjacent photosensors. The color of each photosensor among adjacent photosensors is different over the whole area. In the examples shown in FIGS. 6 and 7, the layout of filters (or micro lenses) has no spatially idle space, providing an efficient pattern.

In the conventional solid state image pickup device shown in FIG. 9, the shape of a filter or a micro lens is limited to rectangular because of the shape of a photosensor. In the embodiments of the invention, however, the number of choices of layouts and shapes of filters or micro lenses increases greatly, and the image sampling point can be optimized and the light convergence of a micro lens can be maximized. Further, generally the same spatial sampling frequency can be used both in the row and column directions and a balanced resolution can be obtained over the whole area of a reproduced image.

In the above embodiments, a solid state image pickup device of the type that charge signals of all photosensors are read at the same time is used by way of example. The invention is not limited only to the above embodiments, but is also applicable to, for example, an interlace type solid state image pickup device of NTSC standards. In this case, some of photosensors, for example, a half of all photosensors is read as one field, and the remaining photosensors are read as another field. In the case of the interlace operation applied to the above embodiments with one transfer stage per one photosensor, a half of all transfer stages is dispersed in an idle signal state (empty packet state). An idle signal contains noise components generated during the transfer period, the noise components including smear caused by light leakage, dark current thermally generated, and other signals. If this idle signal is subtracted from the image pickup signal in the adjacent transfer stage, the S/N ratio can be improved.

As described so far, photosensor rows are disposed on a semiconductor substrate in such a manner that one photosensor row is shifted by a half of a layout pitch of photosensors, relative to another adjacent photosensor row. The column direction charge transfer devices are disposed on the same semiconductor device in such a manner that two column direction charge transfer devices are disposed between adjacent two photosensors in the row direction and one column direction charge transfer device is disposed between obliquely adjacent two photosensors. This structure provides the following advantages.

(1) A spatial sampling point of an image can be optimized and all pixels can be read at the same time.

(2) If a signal for an photoelectrically inactive area is generated through interpolation processing using signals of two photosensors above and under this inactive area, a resolution equivalent to a twofold of actual photosensors can be obtained.

(3) False signals such as moire can be suppressed and a high quality image pickup signal can be obtained.

(4) The number of choices of shapes and layouts of a color filter and micro lens increases and the light reception efficiency can be improved.

(5) A photoelectrically inactive area can be reduced to a large extent and high integration is possible.

(6) Different characteristics of photosensors to be caused by a shift in the relative position of photosensors and column direction charge transfer devices during manufacture processes can be eliminated.

(7) Manufacture techniques of a known two-layer stacked electrode structure can be used making it easy to manufacture solid state image pickup devices.

(8) Since only one column direction charge transfer device is interposed between obliquely adjacent photosensors, a distance between obliquely adjacent photosensors can be shortened considerably as compared to conventional solid state image pickup devices.

(9) In the interlace operation, a signal with a high S/N ratio can be obtained by subtracting the detected noise signal from an image pickup signal.

The present invention has been described in connection with the preferred embodiments. The invention is not limited only to the above embodiments. It is apparent that various modifications, improvements, combinations, and the like can be made by those skilled in the art.

What is claimed is:

1. A solid state image pickup device comprising:
a plurality of photoelectric conversion elements disposed at a predetermined layout pitch in both row and column directions; and
a plurality of column direction charge transfer devices, each for transferring in the column direction, electric charges output from the plurality of photoelectric conversion elements in an associated column,
wherein
those of said photoelectric conversion elements in one row are shifted by about a half of the layout pitch, relative to those photoelectric conversion elements of an adjacent row,
said column direction charge transfer devices stretch along the column direction in a zigzag pattern weaving said photoelectric conversion elements in such a manner that two column direction charge transfer devices are disposed between adjacent two of the photoelectric conversion elements disposed in the row direction and one column direction charge transfer device is disposed between obliquely adjacent two of the photoelectric conversion elements; and
each said column direction charge transfer device includes two conductive electrodes for each row of the photoelectric conversion elements, each of said two conductive electrodes includes a portion extending from a region between obliquely adjacent two photoelectric conversion elements to a region between adjacent two photoelectric conversion elements disposed in the row direction.

2. A solid state image pickup device according to claim 1, further comprising:
one or two row direction charge transfer devices for sequentially reading electric charges output from said plurality of column direction charge transfer devices and transferring the read electric charges in the row direction; and
an output circuit for sequentially outputting voltages corresponding to the amounts of electric charges transferred from the one or two row direction charge transfer devices.

3. A solid state image pickup device according to claim 2, wherein charge transfer directions of two column direction charge transfer devices disposed on both sides of one column of said photoelectric conversion elements are the same, electric charges are transferred from said two column direction charge transfer devices to a common one of said row direction charge transfer device, at least two branch transfer devices are connected to the common one of said row direction charge transfer device, and said output circuit is connected to each of said at least two branch transfer devices.

4. A solid state image pickup device according to claim 3, further comprising:
red, green and blue color filters formed on adjacent three photoelectric conversion elements, one of two column direction charge transfer devices disposed on both sides of one column of said photoelectric conversion elements transferring electric charges from said photoelectric conversion elements formed with said green color filters, and the other transferring electric charges from said photoelectric conversion elements formed with said red and blue color filters;
a first output circuit for outputting voltages corresponding to the amounts of electric charges received from the one of said two column direction charge transfer devices; and
a second output circuit for outputting voltages corresponding to the amounts of electric charges received from the other of said two column direction charge transfer devices.

5. A solid state image pickup device according to claim 2, wherein charge transfer directions of two column direction charge transfer devices disposed on both sides of one column of said photoelectric conversion elements are the same, electric charges are transferred from said two column direction charge transfer devices to different ones of said row direction charge transfer device, and said output circuit is connected to each of the different ones of said row direction charge transfer device.

6. A solid state image pickup device according to claim 1, wherein said photoelectric conversion elements are disposed at generally the same pitch both in the row and column directions.

7. A solid state image pickup device according to claim 1, wherein the distances between centers of three adjacent photoelectric conversion elements among said photoelectric conversion elements are all generally the same.

8. A solid state image pickup device according to claim 1, wherein a two-dimensional relative position of said photoelectric conversion elements and said column direction charge transfer devices is the same for all of said photoelectric conversion elements.

9. A solid state image pickup device according to claim 1, further comprising:

green color filters formed on said photoelectric conversion elements of a first row; and
red and blue color filters alternately formed on said photoelectric conversion elements of a second row.

10. A solid state image pickup device according to claim 9, wherein a plan shape of said color filter is a polygon having six sides or more, a circle, or an ellipse.

11. A solid state image pickup device according to claim 9, wherein one of two column direction charge transfer devices disposed on both sides of one column of said photoelectric conversion elements transfers electric charges from said photoelectric conversion elements formed with said green color filters, and the other transfers electric charges from said photoelectric conversion elements formed with said red and blue color filters, and the image pickup device further comprises a first output circuit for outputting voltages corresponding to the amounts of electric charges received from the one of said two column direction charge transfer devices and a second output circuit for outputting voltages corresponding to the amounts of electric charges received from the other of said two column direction charge transfer devices.

12. A solid state image pickup device according to claim 9, further comprising:
a first output circuit for outputting voltages corresponding to the amounts of electric charges transferred from said photoelectric conversion elements formed with said green color filters; and
a second output circuit for outputting voltages corresponding to the amounts of electric charges transferred from said photoelectric conversion elements formed with said blue and red color filters.

13. A solid state image pickup device according to claim 9, wherein said first and second rows are alternately disposed in the column direction.

14. A solid state image pickup device according to claim 13, wherein arrangements of said red and blue color filters in two said second rows disposed on both sides of one said first row are in reversed order in each other.

15. A solid state image pickup device according to claim 1, further comprising:
red, green and blue color filters formed on adjacent three photoelectric conversion elements, said red, green and blue color filters being disposed so that the colors of adjacent photoelectric conversion elements are different over the whole area of said photoelectric conversion elements.

16. A solid state image pickup device according to claim 15, wherein a plan shape of said color filter is a polygon having six sides or more, a circle, or an ellipse.

17. A solid state image pickup device according to claim 16, further comprising:
a micro lens formed on said color filter for converging light incident upon said photoelectric conversion element, a plan shape of said color filter being a polygon having six sides or more, a circle, or an ellipse.

18. A solid state image pickup device according to claim 1, wherein charge transfer directions of said column direction charge transfer devices disposed on both sides of each row of said photoelectric conversion elements are opposite.

19. A solid state image pickup device according to claim 18, further comprising:
a micro lens formed on said color filter for converging light incident upon said photoelectric conversion element, a plan shape of said color filter being a polygon having six sides or more, a circle, or an ellipse.

20. A solid state image pickup device according to claim 1, wherein a charge transfer direction from said photoelectric conversion elements to said column direction charge transfer devices is the same for all of said photoelectric conversion elements.

21. A solid state image pickup device according to claim 1, wherein each of said plurality of column direction charge transfer devices includes a plurality of charge transfer stages connected in series, each charge transfer stage being provided in correspondence with each of said plurality of photoelectric conversion elements, and signals from all of said photoelectric conversion elements being able to be read by corresponding ones of said charge transfer stages.

22. A solid state image pickup device comprising:

a plurality of first rows of photoelectric conversion elements disposed in a row direction at a predetermined pitch in a column direction perpendicular to the row direction;

a plurality of second rows of photoelectric conversion elements disposed in the row direction at the predetermined pitch, each of said second rows being disposed between adjacent two of said first rows in the column direction, a relative position of each of said first rows and an adjacent one of said second rows being shifted in the row direction;

a plurality of column direction charge transfer devices each for transferring electric charges output from photoelectric conversion elements of one of said first or second rows, two columns of said column direction charge transfer devices being disposed between each set of adjacent two photoelectric conversion elements in said first rows and between each set of adjacent two photoelectric conversion elements in said second rows; and each said column direction charge transfer device includes two conductive electrodes for each row of the photoelectric conversion elements, each of said two conductive electrodes includes a portion extending from a region between obliquely adjacent two photoelectric conversion elements to a region between adjacent two photoelectric conversion elements disposed in the row direction.

23. A solid state image pickup device comprising:

a plurality of charge transfer device stretching generally in one direction, each charge transfer device meandering repeatedly at a constant pitch in a zigzag pattern, adjacent two charge transfer devices having a symmetrical shape and defining open areas therebetween at said constant pitch;

a plurality of photoelectric conversion elements each disposed in each of the open areas; and each said charge transfer device includes two conductive electrodes for each row of the photoelectric conversion elements, each of said two conductive electrodes includes a portion extending from a region between obliquely adjacent two photoelectric conversion elements to a region between adjacent two photoelectric conversion elements disposed in the row direction.

* * * * *